US012726002B2

(12) United States Patent
Winoto et al.

(10) Patent No.: US 12,726,002 B2
(45) Date of Patent: Sep. 1, 2026

(54) MULTIPLE ELECTRODE DISTRIBUTED FEEDBACK LASER ARRAY

(71) Applicant: Cspeed Inc., Palo Alto, CA (US)

(72) Inventors: Ardy Winoto, Santa Clara, CA (US); Gloria Hoefler, Sunnyvale, CA (US); Richard Schatz, Stockholm (SE)

(73) Assignee: Cspeed Inc., Palo Alto, CA (US)

(*) Notice: Subject to any disclaimer, the term of this patent is extended or adjusted under 35 U.S.C. 154(b) by 261 days.

(21) Appl. No.: 18/802,134

(22) Filed: Aug. 13, 2024

(65) Prior Publication Data

US 2026/0051717 A1 Feb. 19, 2026

(51) Int. Cl.

| | |
|---|---|
| ***H04B 10/00*** | (2013.01) |
| ***H01S 5/00*** | (2006.01) |
| ***H01S 5/024*** | (2006.01) |
| ***H01S 5/042*** | (2006.01) |
| ***H01S 5/12*** | (2021.01) |
| ***H01S 5/14*** | (2006.01) |
| ***H01S 5/34*** | (2006.01) |
| ***H01S 5/40*** | (2006.01) |

(Continued)

(52) U.S. Cl.

CPC ............ *H01S 5/124* (2013.01); *H01S 5/0085* (2013.01); *H01S 5/02453* (2013.01); *H01S 5/04256* (2019.08); *H01S 5/141* (2013.01); *H01S 5/34* (2013.01); *H01S 5/4025* (2013.01); *H04B 10/504* (2013.01)

(58) Field of Classification Search

CPC .......... H01S 5/04; H01S 5/042; H01S 5/0421; H01S 5/0425; H01S 5/04254; H01S 5/04256; H01S 5/0427; H01S 5/0625; H01S 5/06258; H01S 5/20; H01S 5/2004

See application file for complete search history.

(56) References Cited

U.S. PATENT DOCUMENTS

| | | | | |
|---|---|---|---|---|
| 6,678,301 B1 * | 1/2004 | Eng | H01S 5/06256 | |
| | | | 372/50.1 | |
| 7,092,589 B2 * | 8/2006 | Kish, Jr. | B82Y 20/00 | |
| | | | 398/91 | |

(Continued)

OTHER PUBLICATIONS

Beyond the 100 Gbaud directly modulated laser for short reach applications, Jianou Huang, Chao Li, Rongguo Lu, Lianyan Li, and Zizheng Cao, Journal of Semiconductors, 2021.

(Continued)

*Primary Examiner* — Daniel G Dobson

(74) *Attorney, Agent, or Firm* — Brian R. Short

(57) ABSTRACT

Apparatuses, methods, and systems for a modulated laser are disclosed. The modulated laser includes a substrate including a plurality of laser segments, a first laser segment comprising a DC electrode, a second laser segment comprising an AC electrode, an isolation barrier formed between the first laser segment and the second laser segment, and a modulated laser cavity spanning from a rear face to a front face of the modulated laser inclusive of the plurality of laser segments, wherein a primary injection current supporting stimulated emission at a desired optical output power out of the front face of the modulated laser is generated when a DC bias is applied to the DC electrode, and wherein a carrier signal of the modulated laser is modulated when an AC signal is applied to the AC electrode, wherein the AC bias is independent of the DC bias.

20 Claims, 10 Drawing Sheets

(51) Int. Cl.
*H04B 10/50* (2013.01)
*H04J 14/00* (2006.01)

(56) References Cited

U.S. PATENT DOCUMENTS

2019/0020178 A1 1/2019 Oguri et al.
2022/0360038 A1* 11/2022 Ishaug .................... G02F 1/017

OTHER PUBLICATIONS

High-Speed Directly Modulated Lasers, Tsuyoshi Yamamoto, Fujitsu Laboratories Ltd.
Enhanced Modulation Bandwidth by Delayed Push-Pull Modulated DFB Lasers, Jiewen Chi, Xun Li, Chuanning Niu, and Jia Zhao, Micromachines 2023, 14, 633.
Directly Modulated Tunable Single-Mode Lasers Based on a Coupled Microcavity, Miao-Qing Wang, You-Zeng Hao, Zhen-Ning Zhang, Bin Zhang, Yue-De Yang 2,3, Jin-Long Xiao, António L. Teixeira, and Yong-Zhen Huang, Photonics 2022, 9, 827.
Tunable DFB lasers integrated with Ti thin film heaters fabricated with a simple procedure, Can Zhang, Song Liang, Hongliang Zhu, Wei Wang, Optics &Laser Technology 54 (2013).

* cited by examiner

MULTIPLE ELECTRODE DISTRIBUTED FEEDBACK LASER ARRAY

FIELD OF THE DESCRIBED EMBODIMENTS

The described embodiments relate generally to optical communications. More particularly, the described embodiments relate to systems, methods, and apparatuses for a multiple electrode distributed feedback laser array.

BACKGROUND

A directly modulated laser (DML) is a distributed-feedback laser diode (DFB) where a single contact is used to modulate current at high speed. Such a drive circuit configuration offers the benefits of being compact and consuming low power. Therefore, DMLs offer an efficient transmission of information at multiple gigabits per second in a cost-effective manner. However, in practice, direct modulation of DFB is limited by its 3 dB bandwidth resulting from the carrier-photon resonance (CPR) frequency (~25 GHz), resulting in achievable data rate≤42 Gbps with additional digital filtering and equalization.

It is desirable to have methods, apparatuses, and systems for a multiple electrode distributed feedback laser array that overcomes bandwidth limitations imposed in typical DML, thereby enabling higher data rates and/or reach.

SUMMARY

An embodiment includes a modulated laser. The modulated laser includes a substrate that includes a first laser segment comprising a DC electrode, a second laser segment comprising an AC electrode, an isolation barrier formed between the first laser segment and the second laser segment, and a modulated laser (longitudinal) cavity spanning from a rear face (facet) to a front face (facet) of the modulated laser inclusive of the plurality of laser segments including the first laser segment and the second laser segment, wherein a primary injection current supporting stimulated emission at a desired optical output power out of the front face of the modulated laser is generated when a DC bias is applied to the DC electrode, and wherein a carrier signal of the modulated laser is modulated when an AC signal is applied to the AC electrode, wherein the AC bias is independent of the DC bias.

Another embodiment includes a method of modulating a modulated laser. The method includes applying a DC bias to a DC electrode of a first laser segment generating a primary injection current supporting stimulated emission at a desired optical output power out of a front face of the modulated laser, applying an AC signal to an AC electrode of a second laser segment modulating a carrier signal of the modulated laser, wherein the modulated laser includes a substrate including a plurality of laser segments including the first laser segment and the second laser segment, an isolation barrier formed between the first laser segment and the second laser segment, and a modulated laser cavity spanning from a rear face (facet) to a front face (facet) of the modulated laser inclusive of the plurality of laser segments including the first laser segment and the second laser segment.

Other aspects and advantages of the described embodiments will become apparent from the following detailed description, taken in conjunction with the accompanying drawings, illustrating by way of example the principles of the described embodiments.

DETAILED DESCRIPTION

The embodiments described include methods, apparatuses, and systems for a modulated laser. For an embodiment, the modulated laser includes a substrate including a first laser segment comprising a DC electrode, a second laser segment comprising an AC electrode, an isolation barrier formed between the first laser segment and the second laser segment, and a modulated laser cavity spanning from a rear face (facet) to a front face (facet) of the modulated laser inclusive of the plurality of laser segments including the first laser segment and the second laser segment. The described embodiments of the modulated laser include a multiple electrode distributed feedback laser (DFB) array that overcomes bandwidth limitations imposed in a typical DML (directly modulated laser) enabling higher data rates and or reach. For at least some of the described embodiments, the distributed feedback laser array includes an array of n-lasers that are independently tuned in wavelength.

At least some of the described embodiments include an array of directly modulated DFB lasers optimized for high-speed modulation in communication systems. Under normal intensity modulated (IM) conditions, the 3 dB bandwidth of the laser can only be increased by increasing the drive current, resulting in higher power consumption and thermal management. The limitation in bandwidth lead to distortions, inter-symbol interference, increased bit error rates limiting the achievable data rate (≤25 Gbps) and transmission.

The lasers of the described embodiments are realized by fabricating multiple electrically isolated electrodes (laser segments) and operate in intensity modulated (IM) or M-ary enhanced data transmission mode. An augmentation of the frequency response, independent of enhancement of the overall 3-dB bandwidth, resulting in improved signal integrity, are observed by applying an alternating current (AC) to a section positioned within the modulated laser cavity, thereby reducing jitter and mitigating signal distortion.

Figure 1:
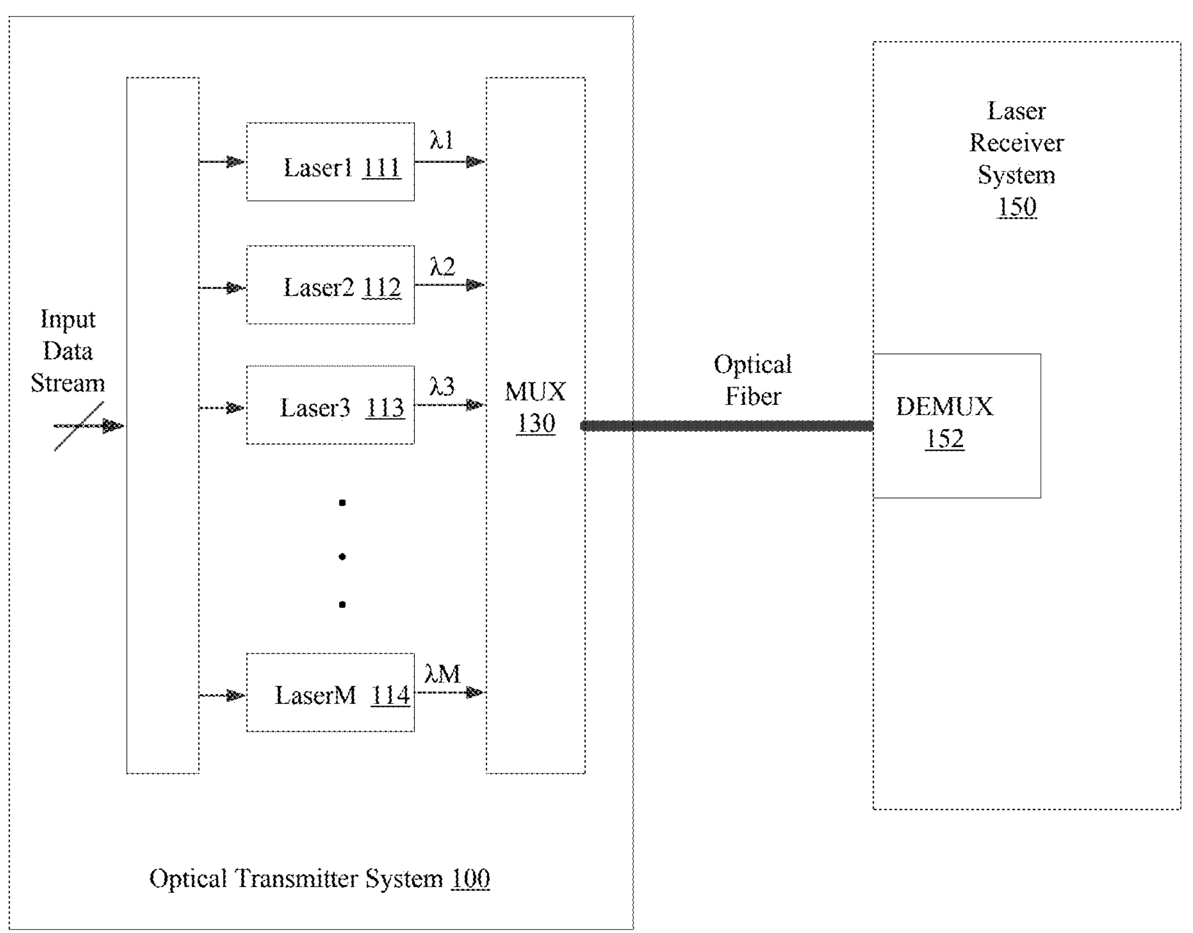
FIG. 1 shows an optical transmitter system, according to an embodiment.

FIG. 1 shows an optical transmitter system 100, according to an embodiment. As shown, the optical transmitter system 100 includes multiple lasers 111, 112, 113, 114, wherein each of the different lasers 111, 112, 113, 114 is configured to generate an optical communication signal having a carrier optical frequency. Each of the different lasers 111, 112, 113, 114 may be a distributed feedback laser. The optical transmitter system 100 receives an input data stream which is used to form signals that are modulated onto the optical signals of the different lasers 111, 112, 113, 114. For an embodiment, a MUX 130 receives optical signals of the different lasers operating at different frequencies (wavelengths) and couples the optical signals to an optical medium, such as, an optical fiber. A laser receiving system 150 can receive the optical signals through a DEMUX 152 after propagating through the optical medium.

Figure 2A:
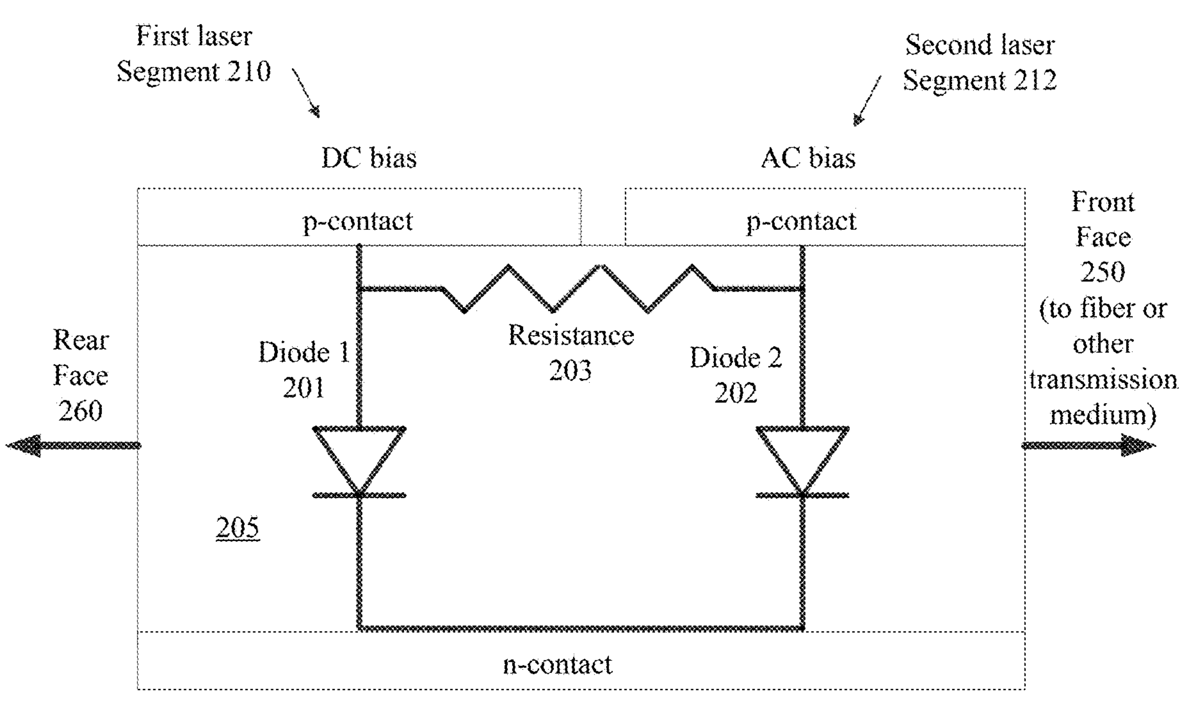
FIG. 2A shows a circuit schematic of a modulated laser, according to an embodiment.

FIG. 2A shows a circuit schematic of a modulated laser, according to an embodiment. As shown, the modulated laser includes at least a pair of optical diodes D1 201, D2 202 formed in a substrate 205. For an embodiment, a DFB laser is a laser diode or optical fiber laser with a low linewidth grating that extends throughout the cavity rather than simply at the opposite edges. Because they are single-frequency laser diodes, distributed feedback lasers are single-mode and have low side-mode suppression.

As shown, for an embodiment, a DC bias is applied to a first laser segment 210 of the first optical diode D1 201, and an AC bias is applied to a second laser segment 212 of the second optical diode D2 202. For an embodiment, a modulated laser cavity of the modulated laser extends from a rear face (facet) 260 to a front face (facet) 250. The first optical diode D1 201 and the second optical diode D2 202 are isolated by a resistance 203 which is realized through the isolation barrier. For an embodiment, AC and DC p-contacts (anodes) are formed directly on top of a p-cladding layer, while an n-contact (cathode) is formed on an n-cladding layer.

Figure 2B:
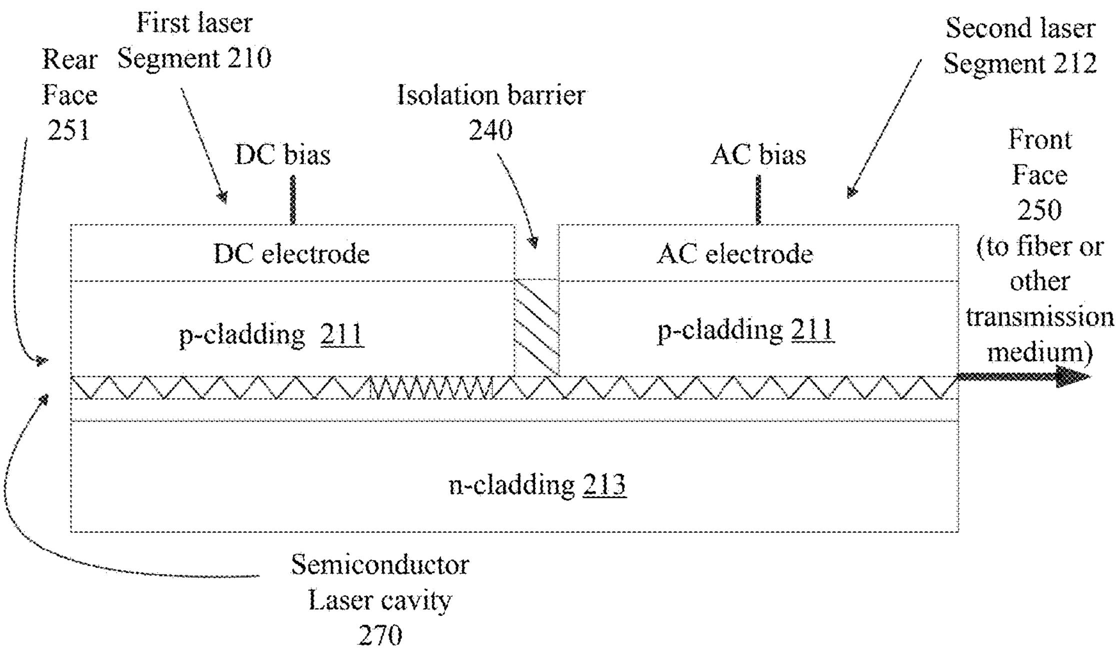
FIG. 2B shows a modulated laser, according to another embodiment.

FIG. 2B shows a semiconductor (modulated) laser, according to another embodiment. As shown, a substrate of the modulated laser includes a plurality of laser segments, including a first laser segment 210 comprising a DC electrode and p-cladding 211, and a second laser segment 212 comprising an AC electrode and p-cladding 211. For an embodiment, an isolation barrier 240 is formed between the first laser segment 210 and the second laser segment 212. For an embodiment, a modulated laser (longitudinal) cavity 270 spans from a rear face (facet) to a front face (facet) of the modulated laser inclusive of the plurality of laser segments including the first laser segment 210 and the second laser segment 212. For an embodiment, a primary injection current supporting stimulated emission at a desired optical output power out of the front face of the modulated laser is provided when a DC bias is applied to the DC electrode of the first laser segment 210. For an embodiment, a carrier signal of the modulated laser is modulated when an AC signal is applied to the AC electrode of the second laser segment 212, wherein the AC bias is independent of the DC bias. For an embodiment, AC and DC p-contacts (anodes) are formed directly on top of a p-cladding layer 211, while an n-contact (cathode) is formed on an n-cladding layer 213.

It is to be observed that the modulation of the AC signal is applied to only a section (the second laser segment 212) of the modulated laser cavity 270 as opposed to the whole cavity of the modulated laser. For an embodiment, the modulated laser cavity 270 is defined by reflectivity on the "front" and "rear" sides (faces or facets) 250, 251, where the reflectivity can be achieved by having mirrors on the front and rear sides (cleaved and coated facets, for example), by defining a DFB grating along the cavity, or by having a distributed Bragg reflector (DBR) on one or both sides of the modulated laser cavity 270.

For an embodiment, the rear or back facet 251 of the semiconductor (modulated) laser is one of the two cleaved or polished surfaces at the ends of the laser cavity. This facet 251 plays a crucial role in the lasing process by providing necessary optical feedback within the modulated laser cavity 270 (either with an anti-reflective or a highly reflective coating). The rear facet coating, in combination with the periodic grating structure (laser grating 335) within the modulated laser cavity 270, ensures that the laser emits a stable, single longitudinal mode output. For an embodiment, the front facet 250 of the semiconductor (modulated) laser is an output surface through which the laser beam is emitted. This facet is crucial in determining the laser's output characteristics and overall performance directly influences the laser's beam quality, and stability.

It is to be observed that for the described embodiments, the semiconductor (modulated) laser is a directly modulated laser whose AC signal and DC bias have been split into two separate contacts (first and second laser segments 210, 212) to alter its optical output characteristics (output power as a function of AC modulation vs. time and frequency). The described embodiments contrasts with some other directly modulated lasers which include one contact being driven by one AC signal inclusive of a DC bias mid-point which acts as a DC bias (although both lasers are typically designed such that the modulated optical signal is collected to a designated front facet). The described embodiments also contrast with other devices that monolithically integrate a laser with another optical device, where the integrated optical device collects the optical output of the laser (from the laser's designated front facet) and passes an altered version of the laser output at the front facet of the combined device. For example, an externally modulated laser (EML), which consists of a laser with an electro-absorption modulator (EAM) attached to its light-collecting (front) side. The purpose of the EAM is to quickly switch between a state which allows the laser output to pass through the EAM with minimal loss (transparent state) and a state which absorbs a majority the laser output (absorbing state), thus modulating the optical power output of the EML as a function of reverse bias modulation voltage applied to the EAM section. An EML typically consists of distinct semiconductor material structures for the laser and EAM segments, where the EAM segment is tailored operate in a transparent state under low reverse bias and in an absorbing state under high reverse bias (typically referred to as wavelength detuning with respect of the specific wavelength of laser operation, although an EML can be constructed with identical laser and EAM materials with performance trade-offs). Similar versions of the externally modulated laser can be achieved by means of different electro-optical modulator devices, such as Mach-Zehnder modulators and micro-ring modulators.

Another common example of a laser combined with another discrete optical device is a laser integrated with a semiconductor optical amplifier (SOA), where the SOA is an electrically pumped optical gain material that serves to provide optical power amplification proportional to the electrical bias. It is possible to use an identical semiconductor material structure for the laser and SOA, but discrete material structures can be utilized to optimize the SOA's maximum power output as well as its gain across wavelength and input power variations. An SOA can be combined with a DML or, in fact, any externally modulated laser, to increase the modulated optical power amplitude at the cost of signal-to-noise-ratio.

Further, the described embodiments are different than a push pull operation technique used to obtain improved performance at high frequencies or data rates. In a push-pull operation, two complementary electrical signals (differential signals) are applied to the laser. One signal increases the current while the other decreases it, and vice versa, creating a balanced modulation scheme. This method involves applying differential signals to the laser to enhance modulation bandwidth and reduce certain undesirable effects like chirp and distortion. The difference between these approaches and the described embodiments is that the direct modulation of the front section of the described embodiments employs a single electrical signal to vary the current supplied to an electrode and modulates the light output.

For an embodiment, the modulated laser cavity is a longitudinal cavity formed by a distributed-feedback (DFB) grating structure. For an embodiment, the cavity of the DFB grating structure is formed using mirrors, distributed Bragg reflectors (DBRs), etched/cleaved facets, coatings, etc.). A distributed-feedback laser (DFB) is a type of laser diode, quantum-cascade laser or optical-fiber laser where the active region of the device contains a periodically structured element or diffraction grating, such as, a grating of the semiconductor laser cavity 270. The structure builds a one-dimensional interference grating (Bragg scattering), and the grating provides optical feedback for the laser. This longitudinal diffraction grating has periodic changes in refractive index that cause reflection back into the cavity.

For an embodiment, the DFB grating structure comprises a periodic corrugation of a first material sandwiched between a second material, wherein a phase shift is included within the periodic corrugation. The first material may include, for example, InGaAsP, and the second material may include, for example, InP. The phase shift can be a single phase-shift of the grating period placed along the longitudinal cavity, multiple phase shifts of the grating period along the longitudinal cavity, or variations of the grating period along the longitudinal cavity to the same effect.

For an embodiment, the modulated laser cavity is formed by a semiconductor multi-quantum well (MQW) epitaxial structure creating vertical confinement and a PN junction as a means to generate an optical field by electrical current injection.

For an embodiment, the modulated laser cavity is a transversal cavity formed by a confined slab waveguide structure. The confined slab waveguide structure may include a ridge waveguide, or a buried heterostructure.

For an embodiment, the isolation layer 240 is formed to provide enough isolation to restrict transfer of a direct or alternating electrical current from the first laser segment 210 to the second laser segment 212, wherein each laser segment includes an electrically discrete element. For the embodiment of FIG. 2B that includes the first laser segment 210 driven by a DC current driver and the second laser segment 212 driven by an AC current driver, the isolation barrier 240 needs to provide enough electrical resistance such that when a DC current is applied to the first laser segment 210, only a very small portion (less than a DC threshold, wherein the DC threshold is defined by the limit of accuracy of the DC current driver used in the application) of the DC current is allowed to transfer through the isolation barrier and induce a measurable DC voltage at the second laser segment 212. Similarly, when an AC current is applied to the second laser segment 212, only a very small portion of said AC current (less than an AC threshold, wherein the AC threshold is defined by the limit of accuracy of the AC current driver used in the application) is allowed to transfer through the isolation barrier and induce a measurable AC voltage swing at the first laser segment 210. Accordingly, the first laser segment 210 will operate with a DC bias provided only by its DC current driver without any perturbation induced (because of the provided isolation) by the AC current drive of the second laser segment 212. The second laser segment 212 operates with an AC signal provided only by its AC current driver, where the nominal DC bias point is set at the average or RMS value of the AC swing and without additional contribution from the DC current drive of the first laser segment 210 because of the provided isolation of the isolation barrier 240.

For an embodiment, the limit of accuracy of the DC and AC current drivers are limited by thermal noise and shot noise of the driver circuit, which may be described as current noise limited. For another embodiment, the DC and AC current drivers include a digital-to-analog converter (DAC), in which case the limit of accuracy of the driver is determined by the resolution (typically in bits) of the DAC as well as current noise.

For an embodiment, the isolation layer includes a separate metal contact definition for the two laser segments and the creation of a highly resistive isolation barrier (240) between the two segments (210, 212) using at least one of: removal of a conductive laser cladding layer by selective semiconductor etch, ion implantation, or layer intermixing.

For an embodiment, the front face 250 is oriented to direct the modulated laser for collection or detection into an optical transmission medium and optical transmission system. It is to be understood that the optical transmission medium may be an optical fiber or a system. The optical transmission system may include one or more multiple optical transmission media such as an optical fiber, free-space optics, or an optical waveguide defined monolithically with the laser or on a separate widget, such that the modulated laser output can be directed to a corresponding photoreceiver.

For an embodiment, the second laser segment 212 including the AC electrode is located proximate to the front-face 250. For an embodiment, the second laser segment 212 comprising the AC electrode is located closer to the front face 250 than the first laser segment 210 comprising the DC electrode. For a directly modulated laser whose output is collected at the front face (facet), applying modulation closer to the front face results in a concentrated modulation of photon density closer to the front face, where the photons have a higher probability and shorter travel time to escape the laser cavity and manifest as the modulated laser output. As a result, the front-modulated scheme can be described as having higher amplitude modulation efficiency, defined as the ratio between the modulated output optical power amplitude over the modulated AC current amplitude. Conversely, applying modulation on the opposite side of light collection face (modulating the rear segment in a front-emitting laser) results in lower amplitude modulation efficiency, since modulated photons will need to, on average, travel a longer distance within the laser cavity to escape through the front face and manifest as the modulated laser output. For a uniform directly modulated laser in which the AC current is applied to one electrode encompassing the whole laser cavity, the modulation efficiency and modulated laser optical output characteristics can be understood as a sum of the front-modulated and rear-modulated cases.

For an embodiment, the DC bias is generated by a DC bias driver, and a capacitive load of the DC bias driver is determined at least in part by a surface area of the DC electrode. For an embodiment, the surface area of the DC electrode is selected to maintain a capacitive load of the DC driver below a certain threshold.

For an embodiment, the AC bias is generated by an AC bias driver, and a capacitive load of the AC bias driver is controlled by at least a surface area of the AC electrode. For an embodiment, the surface area of the AC electrode is selected to maintain a capacitive load of the AC driver below a certain threshold. The capacitive load threshold is typically chosen to be such that the total RC bandwidth of the AC driver and load is not lower than an intrinsic bandwidth of the directly modulated laser, which is limited by a laser carrier-photon resonance (CPR) frequency.

Figure 3:
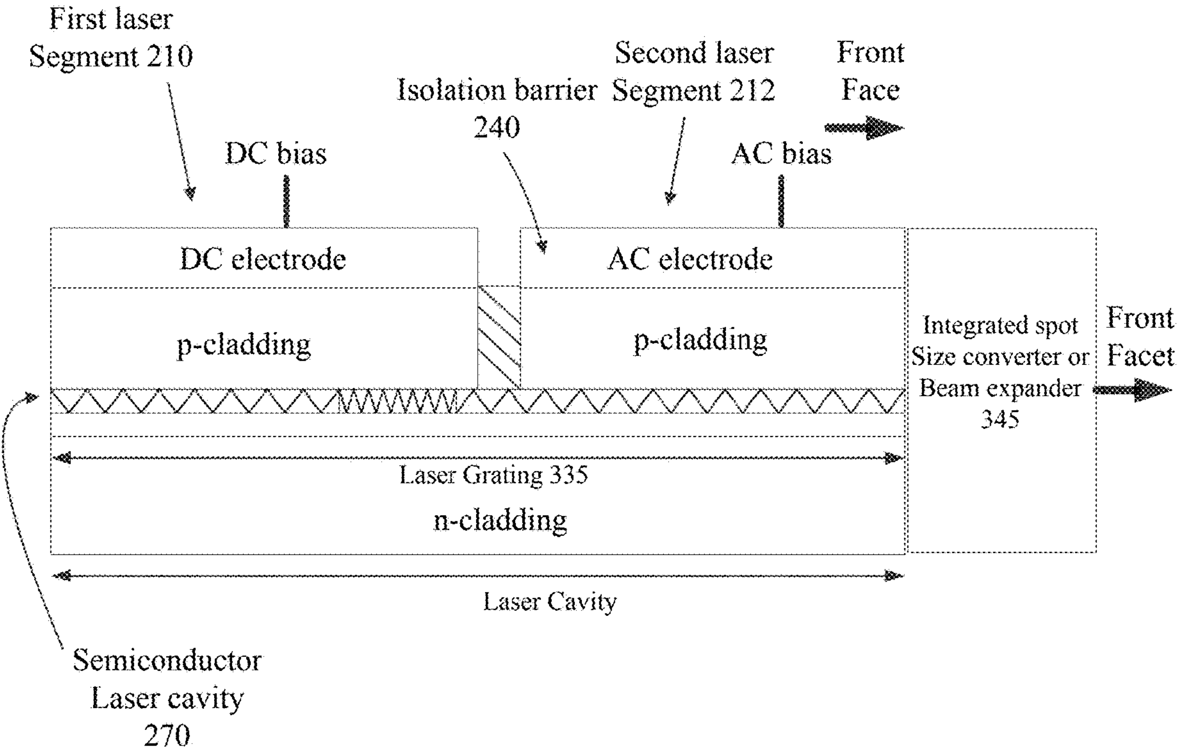
FIG. 3 shows a modulated laser, according to another embodiment.

FIG. 3 shows a modulated laser, according to another embodiment. As shown, for an embodiment, the front face is adjacent to an integrated spot size converter of beam expander 345 for the purpose of increasing optical coupling efficiency between the modulated laser and the intended optical propagation medium in the optical system. The natural mode-field diameters (MFD) of the laser output and the specific optical propagation medium may not be the same, resulting in optical power loss (low optical power coupling efficiency) through excitation of higher-order modes in the optical propagation medium and or requiring a higher degree of physical alignment accuracy to achieve maximum optical power coupling.

As shown the laser grating 335 extends through the modulated laser. That is, for an embodiment, a modulated laser includes a low linewidth grating that extends throughout the cavity rather than simply at the opposite edges.

Figure 4:
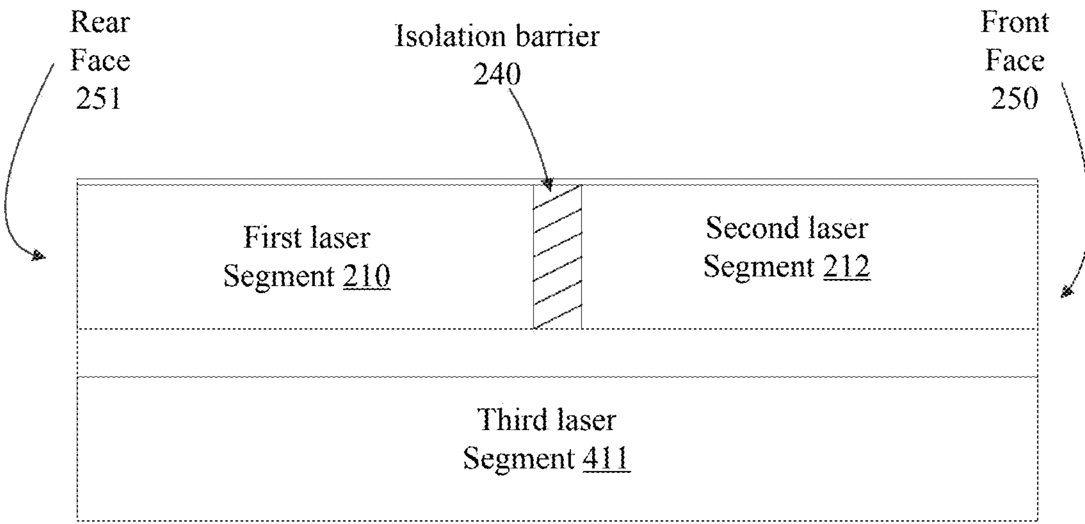
FIG. 4 shows a modulated laser, according to another embodiment.

FIG. 4 shows a modulated laser, according to another embodiment. For this embodiment, the modulated laser further includes a third laser segment 411 that includes a separate electrode (which is one of the previously described plurality of electrodes) that is configured to operate as integrated phase heater positioned within the laser cavity to tweak phase modulation without significantly affecting other laser parameters. In this scenarios, thermal energy is used to control the refractive index of the laser cavity to finely tune the wavelength of the modulated laser, enhancing or adjusting channel spacing and alignment with a subsequent wavelength filter for improved signal quality/integrity. For an embodiment, each laser element in the array is equipped with its own phase heater, allowing independent phase adjustment across the array.

Figure 5:
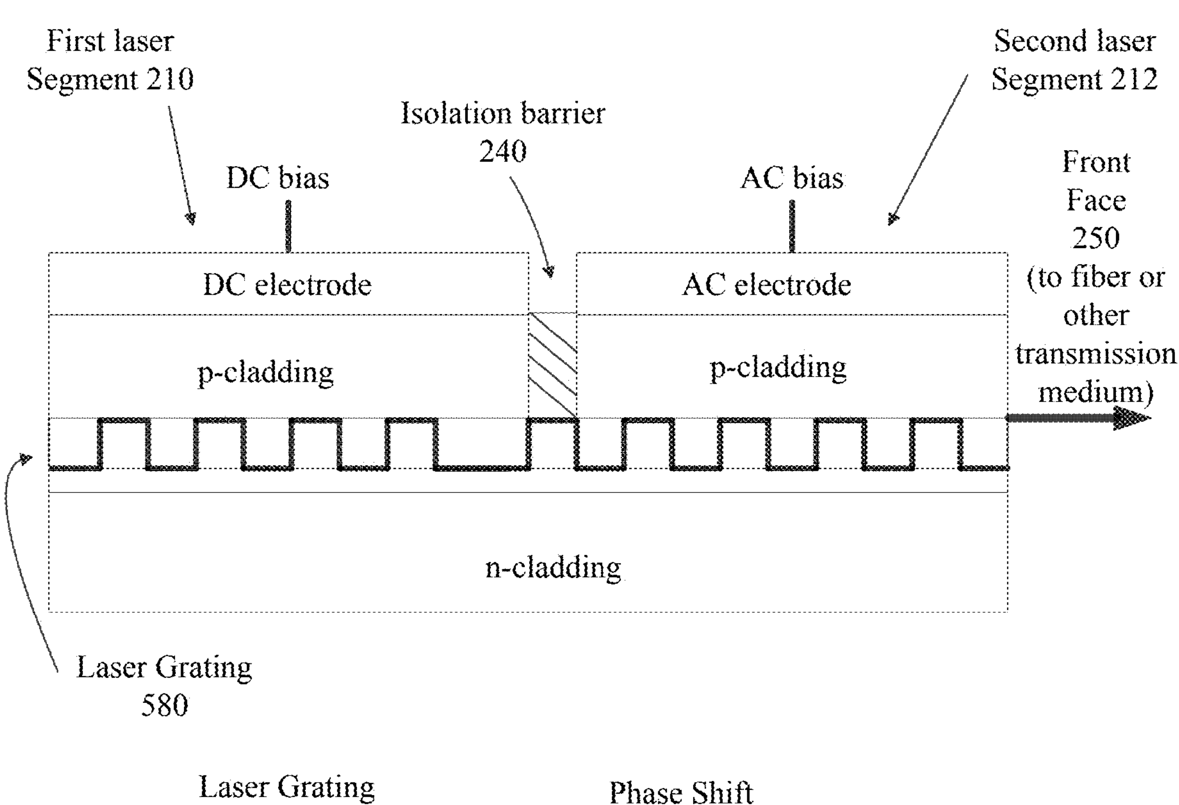
FIG. 5 shows a modulated laser, according to another embodiment.
Figure 5:
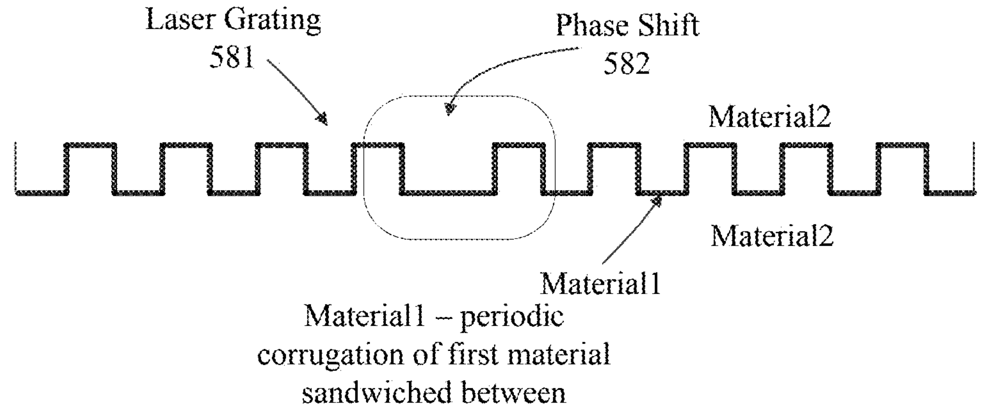

FIG. 5 shows a modulated laser, according to another embodiment. FIG. 5 depicts the laser grating 580, and further depicts the phase shift 582. As previously described, for an embodiment, the grating includes a periodic corrugation of a first material (Material1) sandwiched between a second material (Material2), wherein a phase shift is included within the periodic corrugation. The first material may include, for example, InGaAsP, and the second material may include, for example, InP. The phase shift can be a single phase-shift of the grating period placed along the longitudinal cavity, multiple phase shifts of the grating period along the longitudinal cavity, or variations of the grating period along the longitudinal cavity to the same effect.

Figure 6:
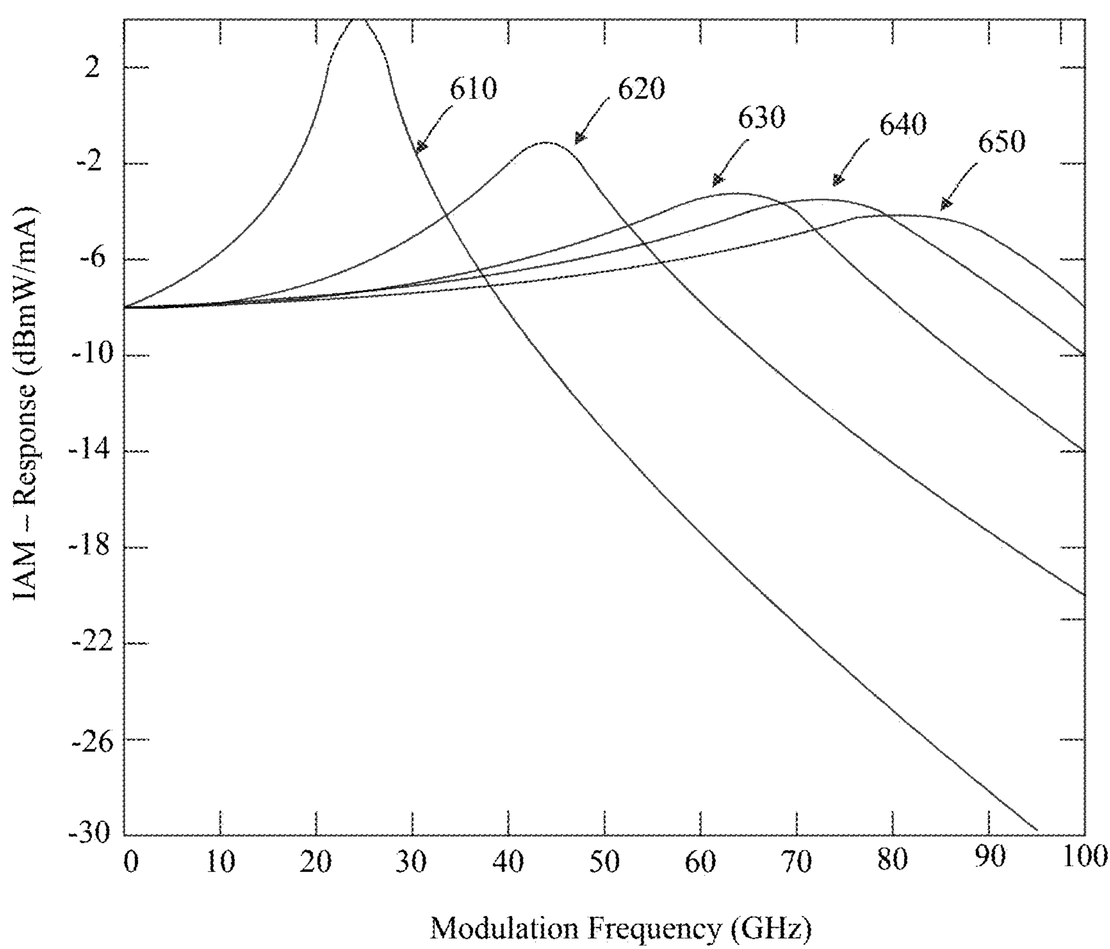
FIG. 6 shows a simulated small-signal amplitude modulation response of a typical directly modulated (DML) distributed feedback laser (DFB), with different responses indicating different operating bias currents, according to an embodiment.

FIG. 6 shows a simulated small-signal amplitude modulation response of a typical directly modulated (DML) distributed feedback laser (DFB), with different responses 610, 620, 630, 640, 650 indicating different operating bias currents, according to an embodiment.

Figure 7:
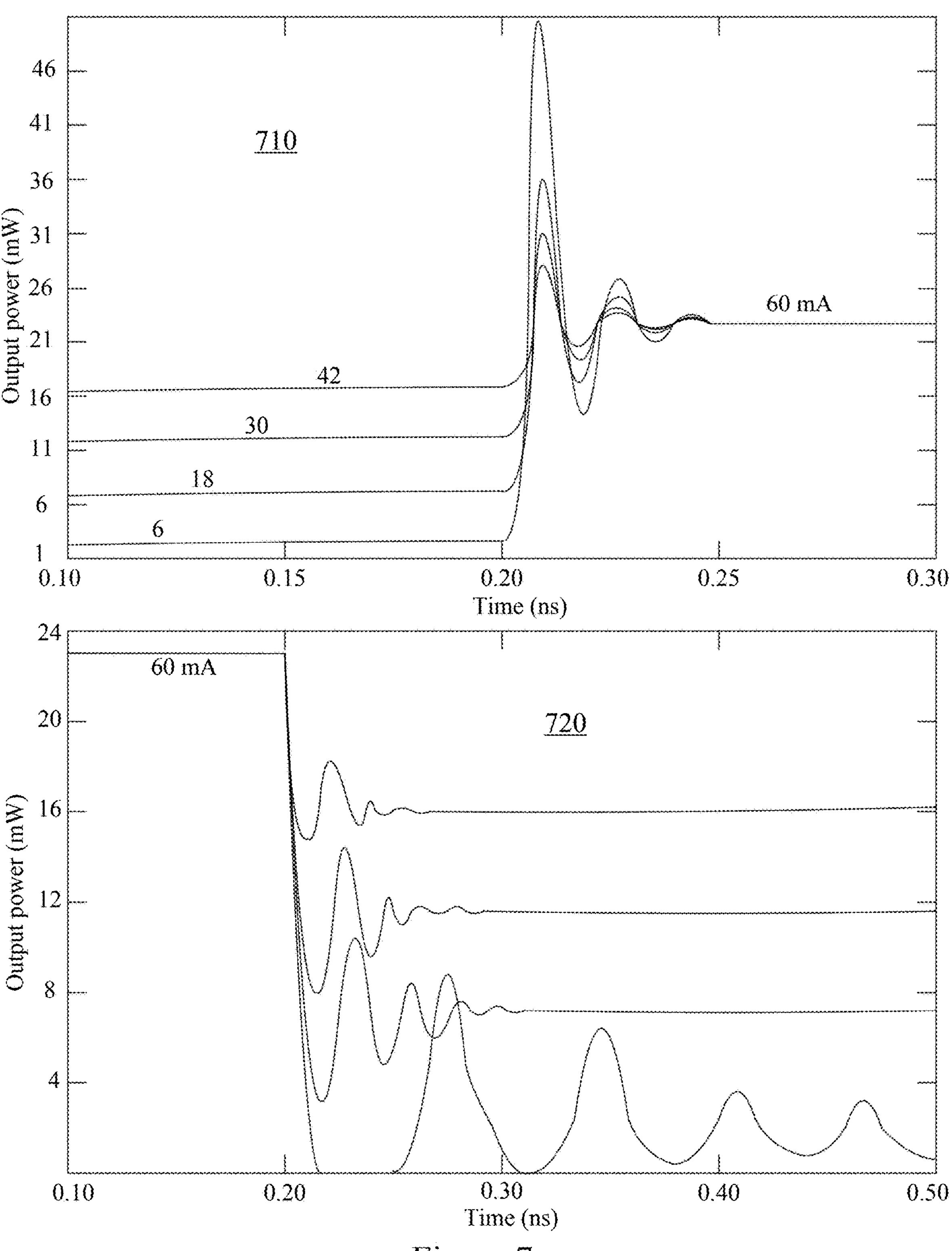
FIG. 7 shows simulated step responses of a typical DML DFB for low to high and high to low transitions.

FIG. 7 shows simulated step responses 710, 720 of a typical DML DFB for low to high and high to low transitions. In both cases, both the magnitude of transient peaks as well as their decay times increase proportionally with the separation of the high and low signal levels.

Figure 8:
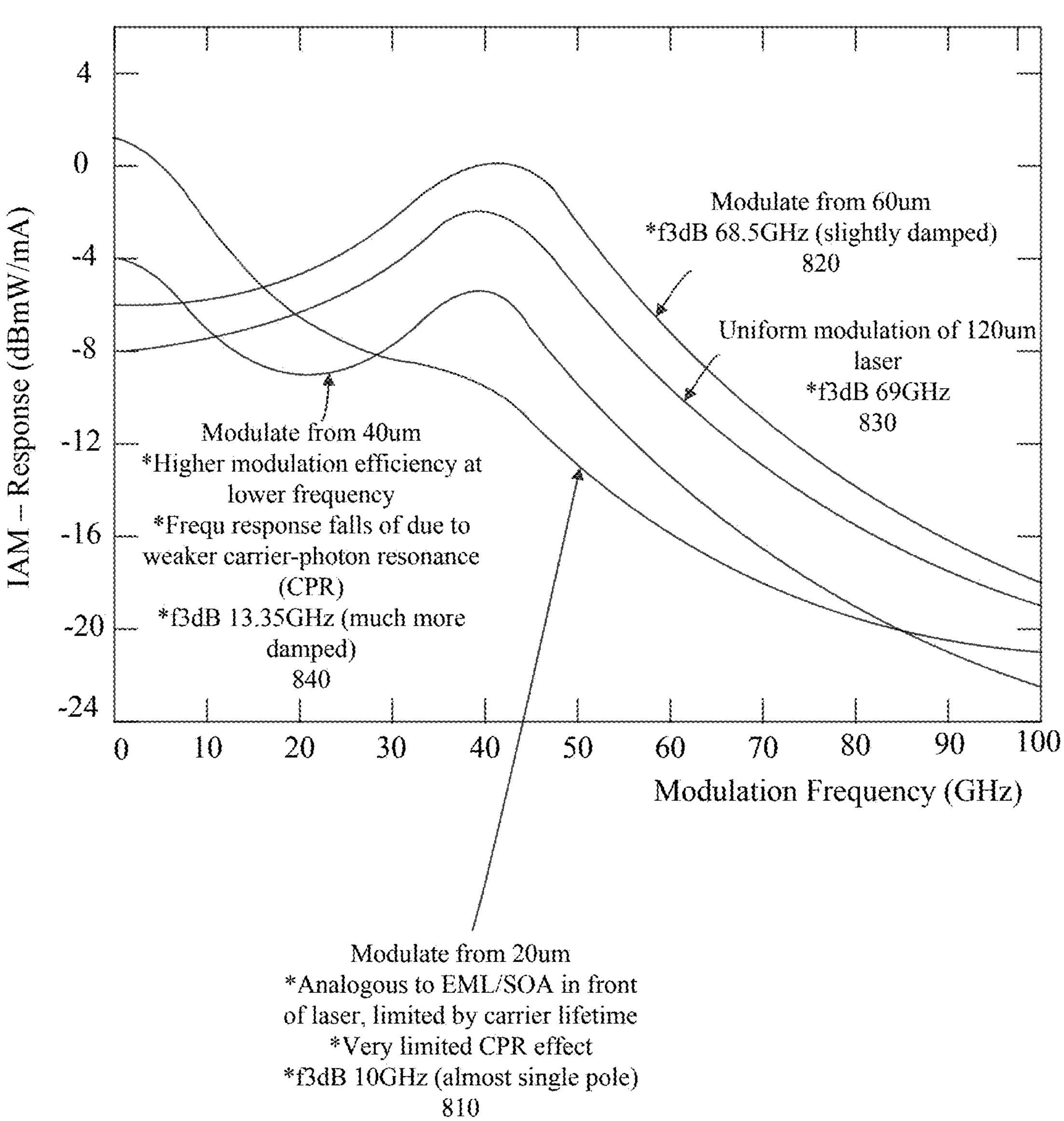
FIG. 8 shows simulated small-signal amplitude modulation responses of a segmented DML DFB, according to an embodiment.

FIG. 8 shows simulated small-signal amplitude modulation responses of a segmented DML DFB. A curve 830 corresponds to a conventional, uniformly modulated DFB similar to FIG. 7. The other curves 810, 820, 840 show the small-signal response of the same laser when varying lengths of the front laser segment is modulated, while the rest of the laser is driven with a DC bias. In all cases, the nominal DC bias of the laser is kept constant.

Figure 9:
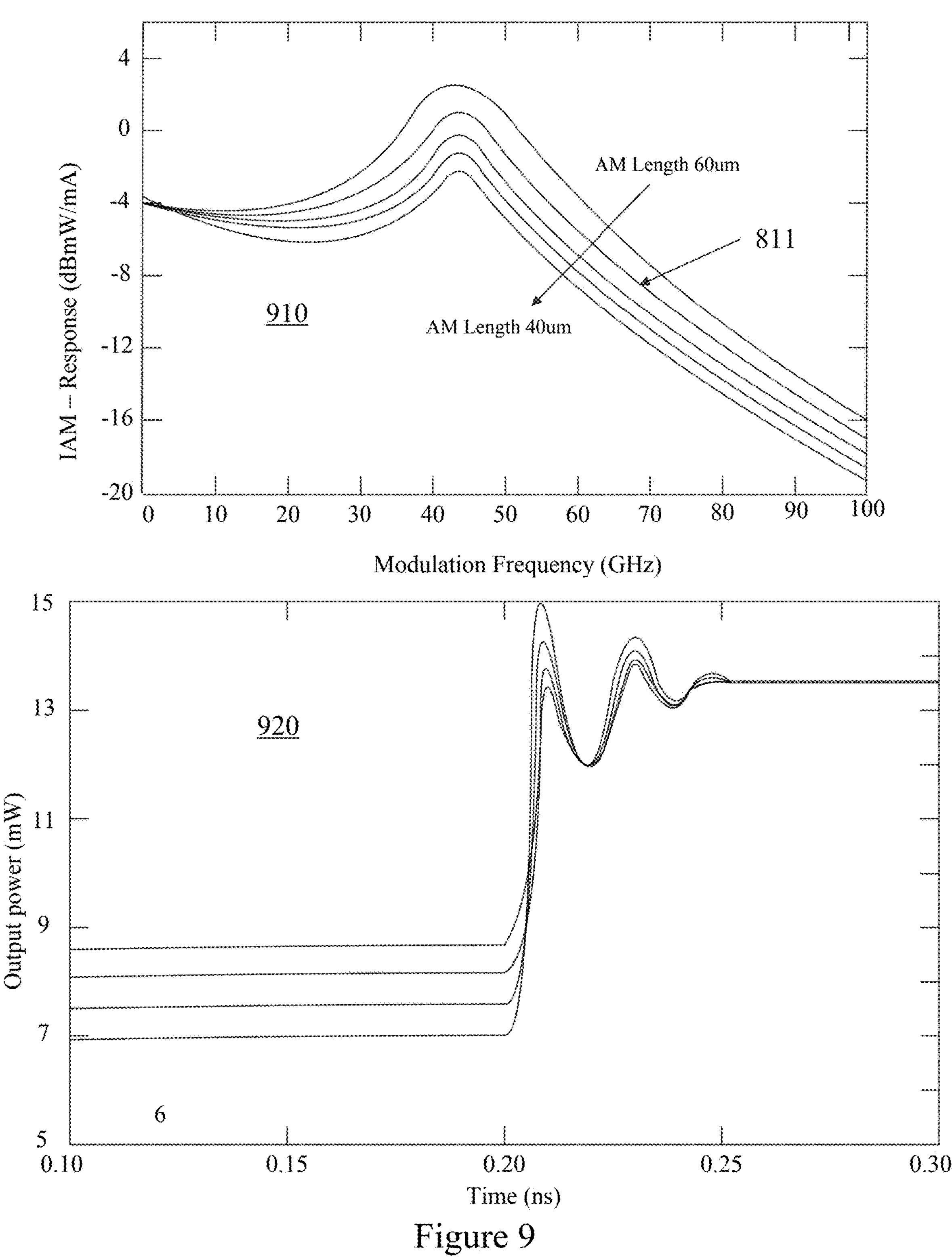
FIG. 9 shows simulated small-signal amplitude modulation responses and step responses of a segmented DML DFB showing optimization of the laser AM length in order to reach a critically damped response, according to an embodiment.

FIG. 9 shows simulated small-signal amplitude modulation responses 910 and step responses 920 of a segmented DML DFB showing optimization of the laser AM length in order to reach a critically damped response. In the critically damped case 911 minimal reduction is observed in the small-signal modulation response, while the step response exhibits a fast rise time with minimal overshoot over the steady-state “high” level.

Figure 10:
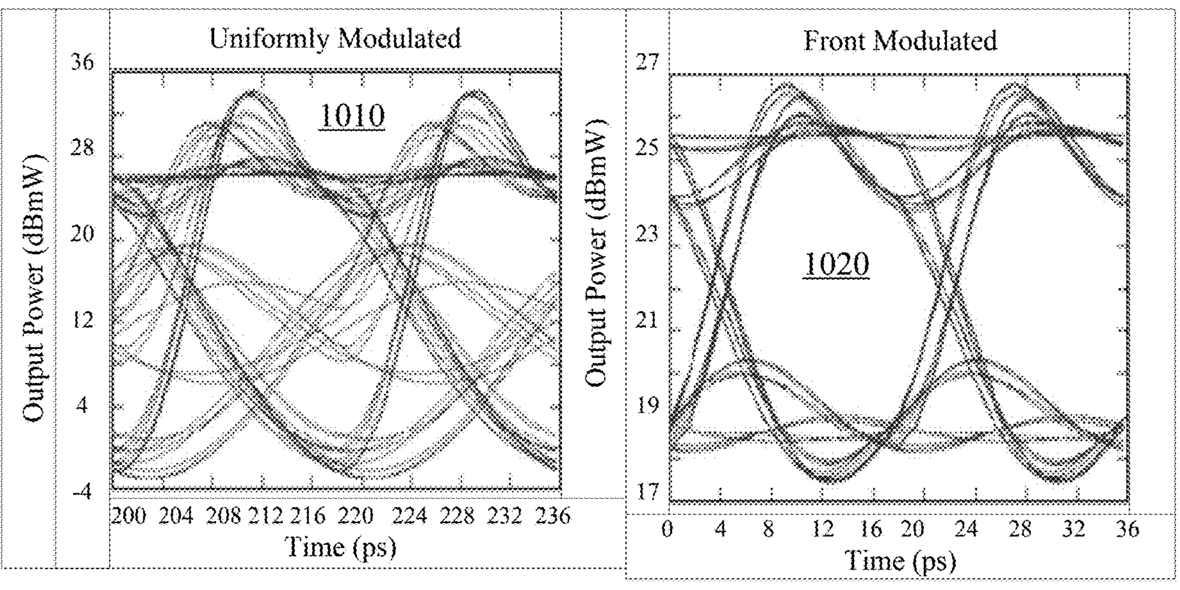
FIG. 10 shows simulated 50 Gb/s eye diagrams of a DML DFB under uniform modulation and front modulation, according to an embodiment.

FIG. 10 shows simulated 50 Gb/s eye diagrams of a DML DFB under uniform modulation 1010 and front modulation 1020 as shown in FIGS. 2A, 2B, 3, 4, 5. In both cases, the laser is kept at an equivalent average bias point. In the front modulated case, the eye diagram shows considerably less jitter and distortion, while also requiring considerably smaller AC current swing than the uniformly modulated DFB.

Although specific embodiments have been described and illustrated, the embodiments are not to be limited to the specific forms or arrangements of parts so described and illustrated. The described embodiments are to only be limited by the claims.

What is claimed:

1. A modulated laser, comprising:

a substrate including a plurality of laser segments;

a first laser segment comprising a DC electrode;

a second laser segment comprising an AC electrode;

an isolation barrier formed between the first laser segment and the second laser segment;

a modulated laser cavity spanning from a rear face to a front face of the modulated laser inclusive of the plurality of laser segments including the first laser segment and the second laser segment;

wherein a primary injection current supporting stimulated emission at a desired optical output power out of the front face of the modulated laser is provided when a DC bias is applied to the DC electrode;

wherein a carrier signal of the modulated laser is modulated when an AC signal is applied to the AC electrode, wherein an AC bias is independent of the DC bias.

2. The laser of claim 1, wherein the modulated laser cavity is formed by a distributed feedback (DFB) grating structure.

3. The laser of claim 2, wherein the DFB grating structure comprises a periodic corrugation of a first material sandwiched between a second material, wherein a phase shift is included within the periodic corrugation.

4. The laser of claim 1, wherein the semiconductor laser cavity is vertically confined by a semiconductor multi-quantum well (MQW) epitaxial structure and creates a PN junction as a means to generate an optical field by electrical current injection.

5. The laser of claim 1, wherein the semiconductor laser cavity is formed by a confined slab waveguide structure.

6. The laser of claim 1, wherein the isolation layer is formed to provide enough isolation to restrict transfer of a direct or alternating electrical current from the first laser segment to the second laser segment, wherein each laser segment includes an electrically discrete element.

7. The laser of claim 6, wherein the isolation layer separates metal contact definition for the first laser segment and the second laser segment and creates a highly resistive isolation barrier between the first laser segment and the second laser segment through at least one of removal of a conductive laser cladding layer by selective semiconductor etch, ion implantation, or layer intermixing.

8. The laser of claim 1, wherein the front face is oriented to direct the modulated laser for collection or detection into an optical transmission medium.

9. The laser of claim 8, wherein the front face is oriented to direct the modulated laser output for collection or detection into an optical transmission system, wherein the optical transmission system includes at least one of an optical fiber, free-space optics, or an optical waveguide.

10. The laser of claim 8, wherein the second laser segment comprising the AC electrode is located proximate to the front-face.

11. The laser of claim 8, wherein the second laser segment comprising the AC electrode is located closer to the front face than the first laser segment comprising the DC electrode.

12. The laser of claim 1, wherein the DC bias is generated by a DC bias driver, and a capacitive load of the DC bias driver is controlled by at least a surface area of the DC electrode.

13. The laser of claim 1, wherein the AC bias is generated by an AC bias driver, and a capacitive load of the AC bias driver is controlled by at least a surface area of the AC electrode.

14. The laser of claim 13, wherein the surface area of the AC electrode is selected to maintain a capacitive load of the AC driver below a certain threshold.

15. The laser of claim 1, further comprising a third laser segment adjacent to the first laser segment and the second laser segment, the third laser segment comprising a heater electrode, wherein the plurality of laser segments is heated when a heater bias is applied to the heater electrode.

16. A method of modulating a modulated laser, comprising:

applying a DC bias to a DC electrode of a first laser segment generating a primary injection current supporting stimulated emission at a desired optical output power out of a front face of the modulated laser;

applying an AC signal to an AC electrode of a second laser segment modulating a carrier signal of the modulated laser;

wherein the modulated laser includes a substrate including a plurality of laser segments including the first laser segment and the second laser segment, an isolation barrier formed between the first laser segment and the second laser segment, and a modulated laser cavity spanning from a rear face to a front face of the modulated laser inclusive of the plurality of laser segments including the first laser segment and the second laser segment.

17. The method of modulating a modulated laser of claim 16, wherein the isolation layer is formed to provide enough isolation to restrict transfer of a direct or alternating electrical current from the first laser segment to the second laser segment, wherein each laser segment includes an electrically discrete element.

18. The method of modulating a modulated laser of claim 16, wherein the front face is oriented to direct the modulated laser for collection or detection into an optical transmission medium.

19. The method of modulating a modulated laser of claim 16, wherein the front face is oriented to direct the modulated laser output for collection or detection into an optical transmission system, wherein the optical transmission system includes at least one of an optical fiber, free-space optics, or an optical waveguide.

20. The method of modulating a modulated laser of claim 19, wherein the second laser segment comprising the AC electrode is located closer to the front face than the first laser segment comprising the DC electrode.

* * * * *